United States Patent [19]

Kopacz et al.

[11] Patent Number: 5,407,548
[45] Date of Patent: Apr. 18, 1995

[54] METHOD FOR COATING A SUBSTRATE OF LOW RESISTANCE TO CORROSION

[75] Inventors: Uwe Kopacz, Hainburg; Christoph Daube, Frankfurt; Andreas Rack, Hanau; Horst Becker; Uwe Konietzka, both of Rodenbach; Martin Weigert, Hanau, all of Germany

[73] Assignees: Leybold Aktiengesellschaft, Hanau; Degussa Aktiengesellschaft, Frankfurt am Main, both of Germany

[21] Appl. No.: 54,690

[22] Filed: Apr. 29, 1993

Related U.S. Application Data

[63] Continuation-in-part of Ser. No. 666,818, Mar. 8, 1991, abandoned.

[30] Foreign Application Priority Data

Oct. 26, 1990 [DE] Germany ............... 40 34 034.1

[51] Int. Cl.⁶ ............................................. C23C 14/34
[52] U.S. Cl. .................. 204/192.15; 204/192.16; 204/192.23
[58] Field of Search ............. 204/192.15, 192.16, 204/192.12, 192.23

[56] References Cited

U.S. PATENT DOCUMENTS

| | | | |
|---|---|---|---|
| 4,013,532 | 3/1977 | Cormia et al. | 204/298.19 X |
| 4,183,797 | 1/1980 | Kennedy et al. | 204/298.09 X |
| 4,231,816 | 11/1980 | Cuomo et al. | 204/192.15 X |
| 4,282,924 | 8/1981 | Faretra | 204/298.09 X |
| 4,426,267 | 1/1984 | Münz et al. | 204/192 R |
| 4,522,844 | 6/1985 | Khanna et al. | 204/192.16 X |
| 4,824,481 | 4/1989 | Chatterjee et al. | 75/246 |
| 4,871,434 | 10/1989 | Munz et al. | 204/192.16 |
| 4,931,169 | 6/1990 | Scherer et al. | 204/298.11 |
| 4,938,798 | 7/1990 | Chiba et al. | 75/230 |
| 4,946,576 | 8/1990 | Dietrich et al. | 204/298.06 |
| 4,959,136 | 9/1990 | Hatwar | 204/192.15 |

FOREIGN PATENT DOCUMENTS

| | | |
|---|---|---|
| 0354391 | 2/1990 | European Pat. Off. . |
| 3107914 | 9/1982 | Germany . |
| 3717044 | 12/1987 | Germany . |
| 239808 | 4/1989 | Germany . |
| 63-312965 | 12/1988 | Japan . |
| 196380 | 4/1989 | Japan . |

OTHER PUBLICATIONS

Firmenschrift GfE, Gesellschaft für Elektrometallurgie mbH, Düsseldorf, "Legierungen Metalle", Ausgabe Mai 1984.
Firmenschrift GfE, "PVD Beschichtungswerkstoffe", erhalten zur Frühjahrsmesse Leipzig 1989.

*Primary Examiner*—Nam Nguyen
*Attorney, Agent, or Firm*—Felfe & Lynch

[57] ABSTRACT

The invention concerns a process for coating a substrate 1 of little or no corrosion resistance, especially a metal substrate having an alloy consisting at least of Ni, Cr and Fe, in an evacuable coating chamber 15, 15a. It comprises making an electrode that can be connected to a current supply 10, this electrode being electrically connected to a target 3 which is sputtered and the sputtered particles of which are deposited on the substrate 1. Reactive process gases are, for this purpose, supplied to the coating chamber 15, 15a, so that an amorphously depositing layer 2 is applied onto the substrate.

11 Claims, 3 Drawing Sheets

METHOD FOR COATING A SUBSTRATE OF LOW RESISTANCE TO CORROSION

BACKGROUND OF THE INVENTION

This application is a continuation-in-part of application Ser. No. 666,818, filed Mar. 8, 1991, now abandoned.

The invention relates to a method for coating a substrate of low resistance or no resistance to corrosion, especially metal, with an alloy containing at least Ni, Cr and Fe in an evacuable coating chamber and utilizing an electrode connectable to a power source and electrically connected to a target which is sputtered, and whose sputtered particles deposit themselves on the substrate, an amorphously condensing coating being applied to the substrate in the coating chamber using a reactive atmosphere.

It is generally known that, if oxygen is permitted unhampered access to the metal surface, the attack on the metal surface generally remains low and that a protective oxide coating can even be formed. If, however, oxygen access to many points is hampered, as for example by fissures, cracks, pores, etc., the material assumes a different potential at this points as a result of differences of concentration in the electrolyte, and it becomes the anode. Under the cover, i.e., in the fissures or pores, the electrolyte becomes deprived of oxygen. An oxygen-poor and an oxygen-rich zone is formed. Corrosion products develop at the boundary between the two zones.

In the use of decorative coatings directly on a substrate that is not corrosion-resistant, local elements form with a severe corrosive attack caused by the great difference in the electrochemical potentials, e.g., about 1.5 V for TiN, and favored by the spikey structure of the hard coating with micropores. To solve this problem, a galvanic intermediate coating is used industrially at this time, which assures sufficient corrosion protection. Such a coating process, however, is very complicated and expensive.

DE-OS 37 17 044 relates to a process for mechanical stability for decorative uses and corrosion resistance. For this purpose a ground body is coated with an amorphous alloy coating. However, how the target is composed or formed is left entirely unanswered.

EP 0 354 391 A1 relates to the depositing of amorphous, corrosion-resistant alloys of the composition $Al_a Ni_b X_c N_d$, in which the sputtering is to be performed in a reactive atmosphere. With the known system it is possible only to coat one side, while with the method according to the invention an all-around coating is possible by means of the double magnetron arrangement. Furthermore, it is also a disadvantage that in the known process as much as 59% of crystalline components are permitted in the depositing.

The method according to U.S. Pat. No. 4,522,844 has the same disadvantages. In this process the corrosion-sensitive layers are covered with a substrate containing Cr, Fe, Ni, Si, B, C or P. The important disadvantage is that sputtering cannot be performed in a reactive atmosphere with the addition of nitrogen.

U.S. Pat. No. 4,231,816 relates to an amorphous metal alloy which is to contain Cr, Fe, Co or Ni. Neither does this patent contain any reference to the preparation of the target for the purpose of arriving at the method of the invention on a cost-effective basis.

On the other hand, the invention is addressed to the problem of making a target material available and treating the surface of the substrate so that the galvanic intermediate coating can be dispensed with.

The problem is solved according to the invention by the fact that the target in the composition at least Ni, Fe, Cr, is made by hot isostatic pressing or uniaxial hot pressing of a suitable powder mixture and is bonded to a magnetron, a massive plate being used as target, which is the same in composition as the thin coating on the substrate, but which target consists of crystalline, not amorphous material. With the process reference is made to an amorphous layer, known in itself, which is applied to a substrate by sputtering, and it is especially advantageous for the target to consist not of an amorphous but, on the contrary, a crystalline material. That is, the cathode is to consist advantageously of a material that is not amorphous in order then to sputter in a reactive atmosphere. To produce such a coating it is no longer necessary to deposit numerous amorphously made bands (cathode) one over the other and stick them together in order then to coat the substrate by sputtering the target in a reactive atmosphere. By the advantageous process an amorphously condensing barrier layer is obtained in a simple manner on the substrate and it contains no grain boundaries or micropores, so that a galvanic intermediate layer can be dispensed with, since this layer applied by cathode sputtering offers sufficient corrosion protection.

For this purpose it is advantageous to add, as a coating step, a glass former as alloying component to the alloy components of the target in addition to Ni, Cr and Fe and to introduce a reactive gas into the coating chamber as process gas. The use of a reactive atmosphere contributes substantially towards forming a perfect amorphous coating and thereby achieving corrosion resistance.

It is furthermore advantageous that the target is composed of the alloy components nickel, iron, chromium, phosphorus and boron, and the reactive atmosphere in the coating chamber contains nitrogen gas.

In further development of the invention, it is advantageous that the alloy components for the target have over 50 atomic-% of Ni, Cr and Fe. The amorphous layers are also made by sputtering the target, the target consisting advantageously of sintered or hot-pressed powder mixtures.

It is furthermore advantageous for the target to have an alloy content of Ni between 30 atomic-% and 40 atomic-% of Cr between 10 atomic-% and 20 atomic-% and of iron between 30 atomic-% and 40 atomic-%. Another possibility, according to a further development of the method of the invention, is for the target to have an alloy content of P between 5 atomic-% and 12 atomic-% and of B between 6 atomic-% and 12 atomic-%.

The target can be made in a simple manner by being produced in the composition Ni, Fe, Cr, P, B, Si, by hot isostatic pressing or by uniaxial hot pressing and bonded onto a magnetron and the substrate is cooled during the vapor depositing process.

It is furthermore advantageous to use a process gas for the depositing of amorphous layers which contain at least carbon (C), oxygen (O), nitrogen (N) or acetylene ($C_2H_2$).

It is furthermore advantageous for the target for the performance of the process to correspond as regards composition and material structure to a thin coating which consists of crystalline material and is formed as a massive plate and is bonded on a magnetron, the target consisting of a powder mixture of Ni, Fe, Cr, P, B. Also it is advantageous for the magnetron to be in the form of a double magnetron with two symmetrically disposed high-power sputtering cathodes which are arranged such that, with the combination of the two opposing gas discharges a uniform plasma is formed in front of the cathodes in the center of the system.

It is also advantageous to select a substrate bias voltage between 50 V and 60 V, especially 60 V, for the depositing of amorphous coatings. With this substrate bias an optimum packing density is obtained without excessive thermal stress on the substrate.

In accordance with the invention, process for coating a substrate, with a metal having an alloy including at least Ni, Cr and Fe, in an evacuable coating chamber comprises sputtering a target of non-amorphous material and consisting of alloy components of at least Ni, Fe, Cr, P, B and produced by hot-isostatic pressing or uniaxial hot-pressing of a suitable powder mixture and then bonded to a magnetron, supplying a reactive gas to the coating chamber, and depositing amorphously a layer on the substrate in the coating chamber.

For a better understanding of the invention, together with other and further objects thereof, reference is made to the following description, taken in connection with the accompanying drawings, and its scope will be pointed out in the appended claims.

BRIEF DESCRIPTION OF THE DRAWINGS

Referring now to the drawings.

DESCRIPTION OF PREFERRED EMBODIMENTS

Figure 1:
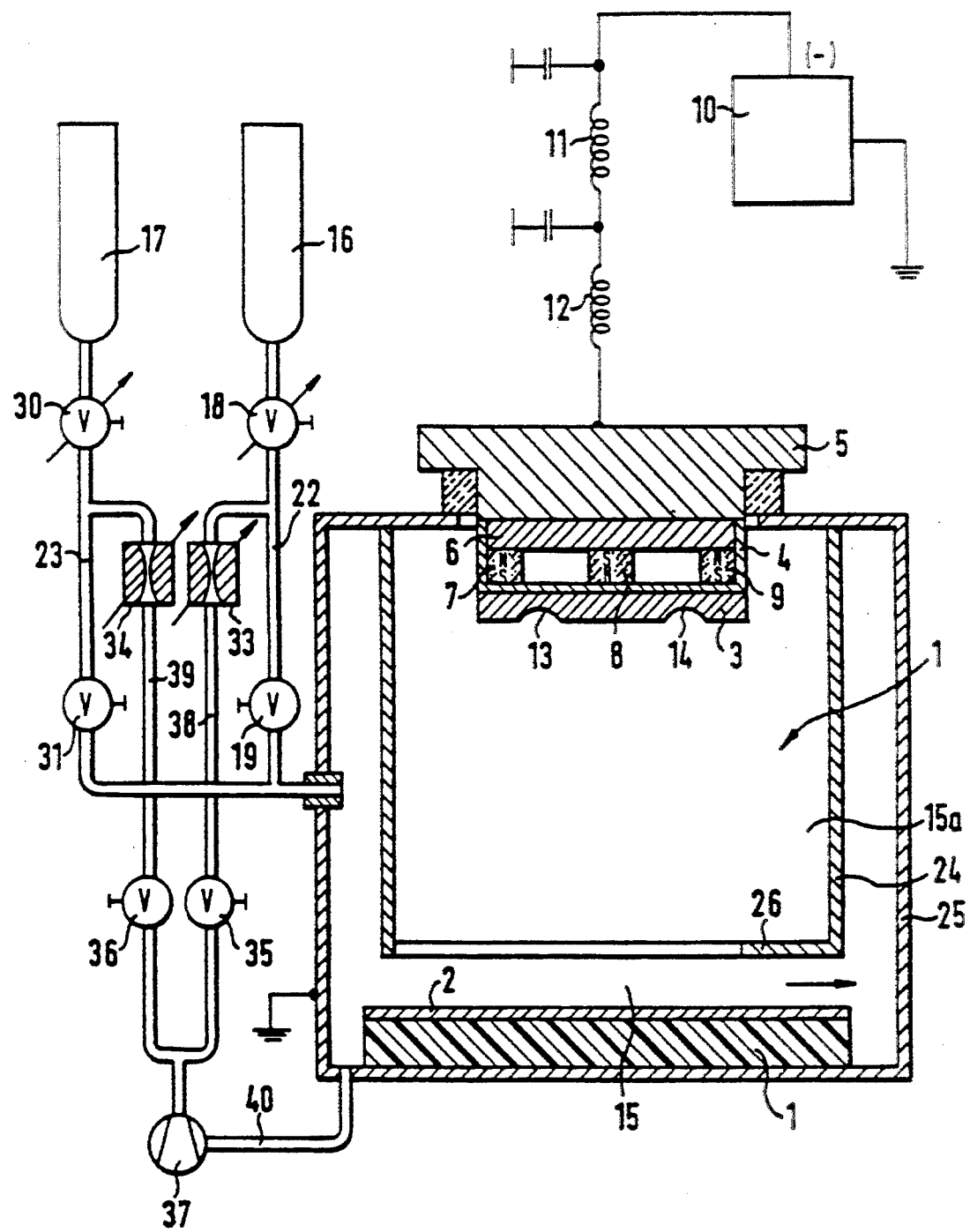
FIG. 1 shows a magnetron arrangement for a process for preparing a barrier layer, FIG. 2 a second embodiment of a coating apparatus with a double magnetron arrangement, FIG. 3 an amorphous atomic arrangement, FIG. 4 a top plan view according to FIG. 2.

In the drawing a substrate 1 is represented which is to be provided with a thin barrier layer. Opposite this substrate 1 is a target 3 which is to be sputtered. The target 3 is connected by an element of U-shaped section to a cathode 5 which rests on a yoke 6 which holds between itself and the element 4 three permanent magnets 7, 8 and 9. The polarities of the poles of the three permanent magnets 7, 8, 9, aimed at the target 3 alternate so that the south poles of the two outer magnets 7, 9 together with the north pole of the center magnet 8 generate an approximately circular arc-like magnetic field across the target. This magnetic field condenses the plasma in front of target 3 so that the greatest density occurs where the magnetic fields reach the maximum of their circular arc. The ions in the plasma are accelerated by an electric field generated due to a direct voltage which is produced by a direct current supply 10. Two inductors 11, 12 connect the negative pole of this direct current supply 10 to cathode 5. The electrical field stands perpendicularly on the surface of target 3 and accelerates the positive ions of the plasma in direction of target 3 in the process chamber 25 and/or in vessel 24. A more or less great amount of atoms or particle is thus ejected from target 3, especially in the areas 13, 14 where the magnetic fields have their maxima. The sputtered atoms or particles travel in direction toward the substrate 1 which is located underneath the diaphragm 26 at the bottom of vessel 24 where they are deposited as a thin layer 2. A non-represented process computer is provided for controlling the represented arrangement. It processes data and releases control commands. This process computer is fed, for example, the values of the partial pressure measured in the coating chamber 15, 15a. Based on this and other data, it controls a reactive gas flow from a cylinder 16 or another gas flow from a cylinder 17, for example, via valves 18, 19 inserted into supply line 22 and via valves 30, 31 inserted into supply line 23. It also adjusts the voltage at cathode 5. Further, the process computer is capable of controlling all other variables, for example the power supply.

Figure 2:
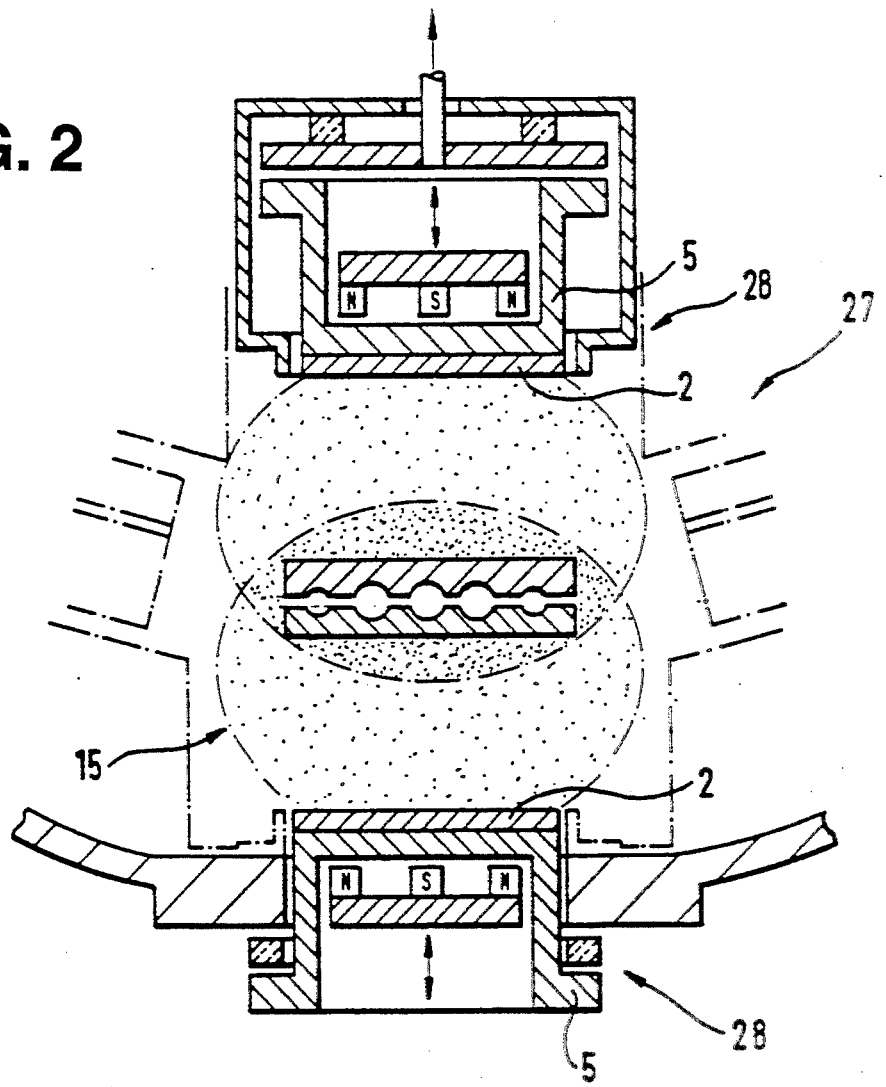
Figure 3:
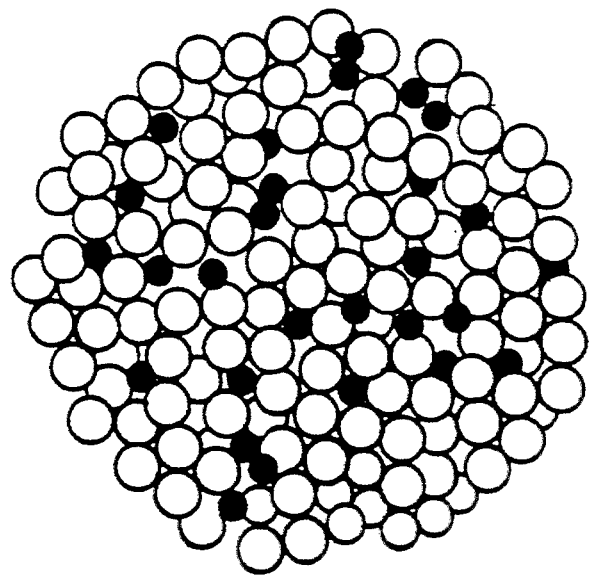

The apparatus of FIG. 2 has a non-represented pump unit for generating a high vacuum. A non-represented direct current supply is used to carry out the ion etching process. Another direct current supply serves to generate the substrate bias voltage during the coating process. Two supply units for sputter current are available to supply power to the cathode. These power supply units are current-controlled and can release a maximum of 23 A and 750 V. For high performance cathode sputtering, the apparatus can be provided with four cathodes.

The double magnetron 28 represented in FIG. 2 includes two symmetrically arranged high performance sputtering cathodes 5. A homogeneous plasma is created in the center of the arrangement due to the superimposition of two opposite gas discharges in front of the cathodes.

This plasma has a coating area with largely uniform deposition conditions. This arrangement allows a uniform allround coating of shaped articles without self-rotation. Advantageously, the magnetron 27 has a device for changing the position of the magnetic field to influence the characteristic operating features of cathode 5 by adjusting the field strength on the target surface.

The coating apparatus of the drawing can be easily operated via a non-represented microprocessor. This allows a complex coating process with approximately 48 individual, exactly reproducible process layers. The energy supply for the sputtering is current-controlled. It is, however, also possible to use line control.

For the free-sputtering of a double magnetron arrangement 28, a diaphragm 42, which is mounted to a rotating device 41 for the substrate, is placed between the cathodes 5. Subsequently, the cathodes 5 are sputtered free in two stages. The first stage is a short sputtering at a low pressure and a low cathode current; in the second stage both pressure and current are increased. The sputter current then exceeds the current during the coating. The pressure is approximately equal to the coating pressure:

Typical free-sputtering parameters are:

Work pressure: $P_f = 6.0 \times 10^3$ mbar, sputtering current $I_f = 3.0$ A, $t_f = 0.5$ min.

The free-sputter time is determined by the target material and the coating process that is employed.

Figure 4:
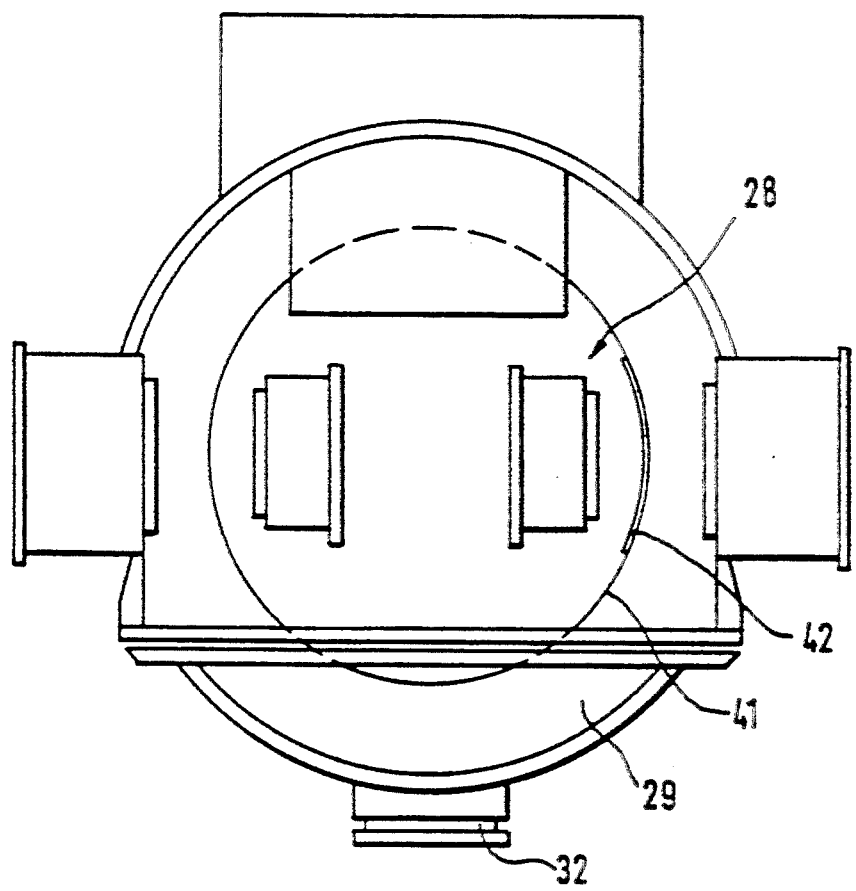

According to FIG. 4, a viewing window 32 for monitoring the operation is included in a recipient door 29 of the coating apparatus of the double magnetron arrangement 28.

It is generally known that when the metal surface is freely exposed to the oxygen, the effect on the metal surface is generally low permitting even a protective oxide layer to form. Further, it is also known to coat the surface to be protected with a metallic coat resulting in passive corrosion protection. In most cases, however, the metallic coat is not absolutely tight but has defective spots or pores and cracks. In order to minimize the effects of contact corrosion, for example, it is advantageous to apply a pore-free coat onto the substrate. So far a pore-free coat, especially for decorative layers, involved a great amount of expenses, in particular when the surface was to exhibit sufficient brilliance.

In order to obtain a satisfactory barrier layer, provision must be made for a target material, and the surface of the substrate must be treated such that the galvanic intermediate layer can be omitted.

One coating step includes the production of amorphous layers by sputtering a target 3 consisting of non-amorphous (crystalline) initial material. For this purpose, the target composed of $Ni_{36}$, $Fe_{33}$, $Cr_{14}$, $P_8$, $B_9$ is hot-isostatically pressed and bonded to a corresponding magnetron.

In order to optimize the layer properties of amorphous barrier layers, it is necessary to adjust certain parameters. Important influencing variables include substrate bias voltage and nitrogen partial pressure. A substrate bias voltage of 60V, for example, is particularly advantageous.

Moreover, it is particularly advantageous when a glass forming agent is added to the alloy components and when a reactive gas, e.g. $N_2$ is supplied to the coating chamber 15a as a process gas. It is thus possible to deposit the layer amorphously without any problems.

When decorative layers are applied directly on non-corrosion resistant substrates 2, highly corrosive local elements are formed due to the great difference of the electrochemical potentials (e.g. for TiN approximately 1.5 V) and promoted by the spur-like structure of the hard layer with the micropores.

The adhesive strength of layer 2 on substrate 1 is significantly increased by the use of helium as a process gas until a layer thickness is reached (e.g. Aluminum 350 s 400 A) that is impermeable to the UV radiation of the subsequent argon process.

For the sputtering process, for example, an argon plasma is maintained in the coating chamber in a first phase of the process for an extremely short period of time. It is maintained so long until the generated sputtering process, especially due to the degassing of the PMMA substrate, passes from the oxidic process on to the metallic process. Then, in a second phase of the process, helium is introduced into the coating chamber 15a via a supply line 22 so that a helium plasma can be ignited. Then, in a third process phase, argon is again supplied to the coating chamber 15, 15a via supply line 23 and an argon plasma is ignited. This argon plasma process is maintained until the desired thickness of layer 2 is reached.

For a rapid rinsing and pumping out of the coating chamber 15a and of the individual gas supply lines 22, 23 and the connecting piece upon completion of the process phases (I, III), a special vacuum pump 37 is connected via pump-down lines 38, 39 to lines 22, 23 and to the coating chamber 15a. These pump-down lines 38, 39 have valves 35, 36 that prevent gas from escaping from the cylinders directly to the outside when valves 18, 30 are opened. In order to reduce the gas escape from pipes 22, 23, throttle valves 33, 34 are incorporated into lines 38, 39.

While there have been described what are considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. Process for coating a substrate with an alloy including at least Ni, Cr, and Fe, in an evacuable coating chamber comprising sputtering a target of non-amorphous material and consisting of alloy components of at least Ni, Fe, Cr, P, B and produced by hot-isostatic pressing or uniaxial hot-pressing of a suitable powder mixture and then bonded to a magnetron, supplying a reactive gas to the coating chamber, and depositing an amorphous layer on the substrate in the coating chamber.

2. Process in accordance with claim 1, which includes adding a glass forming agent as an alloy component to the alloy components of the target.

3. Process in accordance with claim 1, in which the target is composed of the alloy components nickel, iron, chromium, phosphorous and boron, and the reactive atmosphere in the coating chamber contains $N_2$.

4. Process in accordance with claim 1 in which alloy components for a target contain over 50 atomic- % Ni, Cr and Fe.

5. Process in accordance with claim 4 in which in the target, the percentage of Ni in the alloy is between 30 atomic- % and 40 atomic- %, the percentage of Cr between 10 atomic- % and 20 atomic- % and the percentage of Fe between 30 atomic- % and 40 atomic- %.

6. Process in accordance with claim 4 in which in the target, the percentage of P in the alloy is between 5 atomic- % and 12 atomic- % and the percentage of B is between 6 atomic- % and 12 atomic- %.

7. Process in accordance with claim 4 which includes producing the target composed of Ni, Fe, Cr, P, B by hot-isostatic pressing or uniaxial hot-pressing of a powder mixture and then bonding the target onto a magnetron.

8. Process in accordance with claim 4 in which the target includes an alloy containing Ni, Fe, Cr, Si, B.

9. Process in accordance with claim 1 which includes cooling the substrate during the deposition process.

10. Process in accordance with claim 1 which includes using for the deposition of amorphous layers, a process gas selected from a group consisting of carbon (C), oxygen (O), nitrogen (N) and acetylene ($C_2H_2$).

11. Process in accordance with claim 1 using a double magnetron composed of two symmetrically arranged sputtering cathodes and creating a homogeneous plasma when superimposing two opposing gas discharges in front of the cathodes.

* * * * *